United States Patent [19]
Fessard

[11] 3,984,863
[45] Oct. 5, 1976

[54] METHODS AND DEVICES FOR STABILIZING THE REST FREQUENCY OF FREQUENCY MODULATED OSCILLATORS

[75] Inventor: Roland Fessard, Gentilly, France

[73] Assignee: Engins Matra, France

[22] Filed: Jan. 17, 1975

[21] Appl. No.: 542,053

[30] Foreign Application Priority Data

Feb. 4, 1974  France .............................. 74.03685

[52] U.S. Cl. ................................................. 358/25
[51] Int. Cl.² ........................................ H04N 9/40
[58] Field of Search ................... 358/10, 12, 14–17, 358/21, 23–25, 40; 332/16 R, 18, 19; 331/1 R, 2, 14, 18, 20, 23; 178/7.1, 7.2

[56] References Cited
UNITED STATES PATENTS

| | | | |
|---|---|---|---|
| 2,296,919 | 9/1942 | Goldstine | 332/19 |
| 2,501,368 | 3/1950 | White | 332/19 |
| 2,559,719 | 7/1951 | Hershberger | 332/19 |
| 2,968,769 | 1/1961 | Johnson et al. | 332/19 |

FOREIGN PATENTS OR APPLICATIONS 1,273,937   9/1960   France

*Primary Examiner*—John C. Martin
*Attorney, Agent, or Firm*—Larson, Taylor and Hinds

[57] ABSTRACT

The rest frequency of an oscillator supplying a subcarrier modulated in frequency by the chrominance signal from a SECAM television transmitter, is servocoupled to a reference frequency during the frame return periods and a phase shift of the oscillator is effected during the line return periods, shorter than the frame return periods. The servocoupling device comprises a reference frequency generator, and a servocoupling loop comprising a switch member and storage means for storing a parameter which controls the rest frequency of the ocillator, and control means for actuating the switch into closed condition, so closing the loop during the frame sweep return periods. The oscillator comprises means for phase setting during line return periods, shorter than the frame return periods.

12 Claims, 7 Drawing Figures

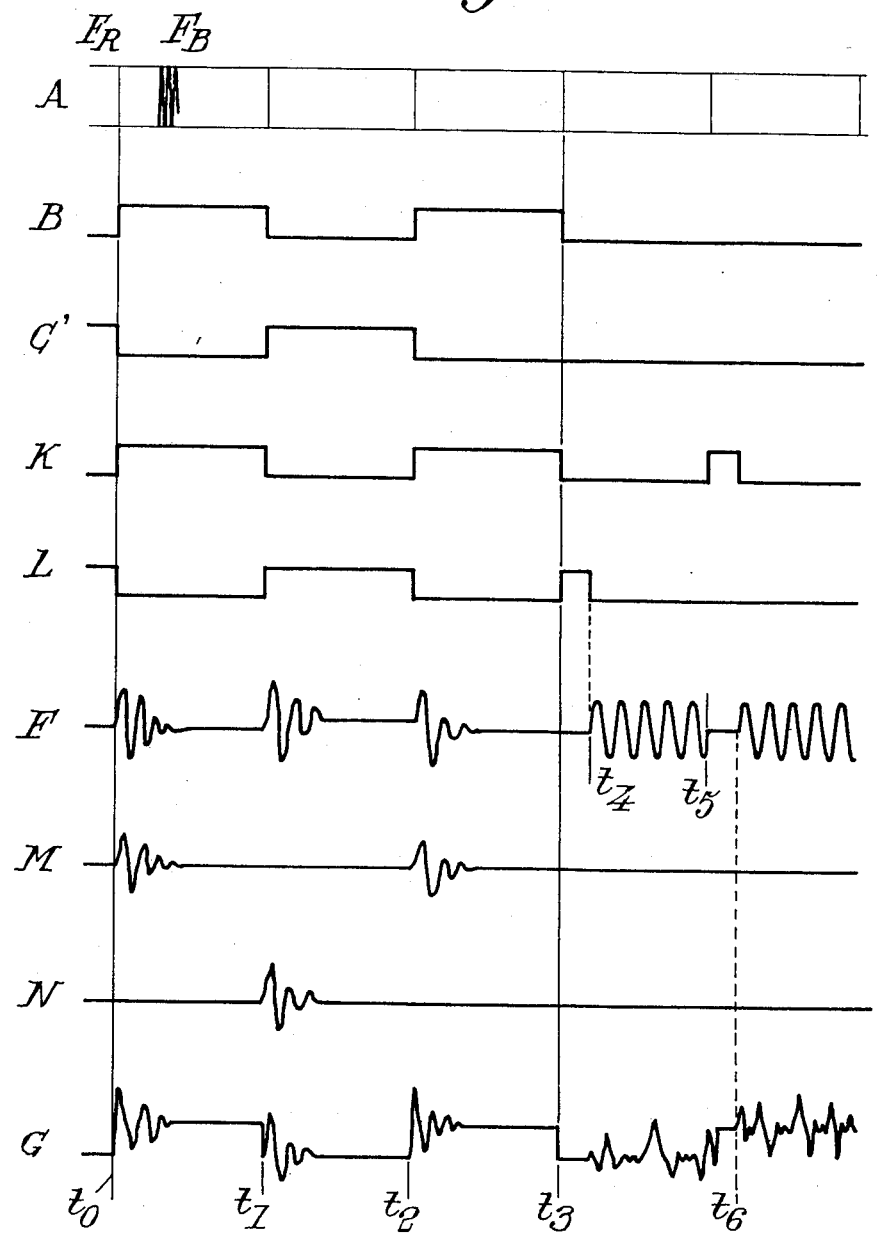

METHODS AND DEVICES FOR STABILIZING THE REST FREQUENCY OF FREQUENCY MODULATED OSCILLATORS

The present invention relates to methods and devices for stabilizing the rest frequency or frequencies of frequency modulatable (FM) oscillators, such as those used for supplying chrominance sub-carriers in coders of SECAM color television systems, at the same time as the phase locking of these oscillators.

Numerous methods of stabilizing or servocoupling the rest frequency of frequency modulated oscillators exist. A first method consists obviously of stabilizing the temperature of the components and the applied voltages: if this has the advantage of supplying a permanent stabilization, it has the drawback of only ensuring it at the end of a relatively long period after the application of voltage. Consequently, the methods used are generally servocoupling methods of the rest frequency of the oscillator during dead times separating the active times during which it is modulated in frequency.

Among these methods, one is particularly important, as it is currently used to stabilize the frequency and the phase of the one or more oscillators frequency modulated by a television signal, notably in SECAM transmittor coders where the same oscillator supplies alternately the two sub-carriers at rest frequencies $F_{OB}$ and $F_{OR}$ provided to transmit the color difference signals $D'_B$ and $D'_R$ (differences between luminance and blue and red chrominances). This method applies a phase locking loop, closed during the dead times and open during the active modulation periods. This method implies strict coupling between the phase of the coupled oscillator and the phase of the reference oscillator at fixed frequency, which constitutes a restriction which, in certain cases, is troublesome, as will now be seen in referring more specifically to the case of SECAM color television coding, where the dead times used are the line sweep or horizontal sweep return periods.

In this particular case, the single oscillator which must be servocoupled in frequency supplies sequentially a first rest frequency $F_{OR}$ sub-carrier modulated in frequency by the data $D'_R$ (red chrominance signal), then a certain rest frequency sub-carrier $F_{OB}$ modulated in frequency by the other data $D'_B$. The method currently used at the present time consists of closing a phase locking feedback loop during the horizontal sweep return periods, by supplying alternately and sequentially to this loop fixed reference frequencies $F_R$ and $F_B$. The longer dead times constitued by the return periods of the frame sweep or vertical sweep are not used. It is seen that the servocoupling sequence of the oscillator is at a rate which corresponds to the line half-frequency.

To reduce the visibility on television screens in black and white of interference patterns (patterns of dots) caused by the presence of the modulated sub-carrier, it is necessary to restore in phase the sub-carrier before the beginniing of each period of scanning of the horizontal sweep (line scan), then to effect sequential phase inversions. To resolve this problem, and due to the fact of the close phase coupling between the coupled oscillating signal and the oscillating reference signal, one is brought to use reference frequencies $F_B$ and $F_R$ which are two whole multiples $A.F_H$ and $B.F_H$ of the horizontal sweep frequency $F_H$: in French standards, $F_B$ and $F_R$ are given the values 272 $F_H$ and 282 $F_H$.

In view of the very short duration of the fraction of dead time reserved for the phase coupling (less than 10 $\mu$ sec), it is necessary in most cases, to bring the phase of the coupled oscillating signal to a value close to that which it has once the servocoupling is effected: for this the modulatable oscillator which supplies this signal by means of a short pulse at the beginning of each horizontal sweep return period is temporarily blocked, the oscillation of the pulse being resumed with a predetermined phase at the end of the blocking.

The reference frequencies $F_B$ and $F_R$, which are multiples of the line frequency, may be generated by various means.

A first solution consists of forming synchronization signals by dividing one of the reference frequencies $F_B = A.F_H$ and $F_R = B.F_H$, then generating the other reference frequency by the addition or subtraction of $(B - A).F_H$, then by filtering the fundamental; another solution, which is the most currently employed in French made equipment, consists of controlling the synchronizing generator by a high stability oscillator (a quartz oscillator for example) permitting the use of a band pass filter of narrow band pass width $\pm F_H/n$ which selects the desired harmonic and rejects the higher or lower rank harmonics, but the frequency $F_H$ must then have a better stability than $\pm 1/nk$ in order that the harmonic to be used should remain within the band pass of the filter (K being the rank of the harmonic used, that is to say A or B, 272 or 282 on the French standard). Since $n$ cannot in practice be less than 2, the stability of $F_H$ must be $2 \times 10^{-3}$ at least. This stability requirement forbids the use of generators controlled by the frequency of the electric supply mains, even if it is the national grid.

In the case of a network including several transmitters and coders and a fortiori in the case of a national network with interconnections and transcodings which require high stability of frequency to ensure inter-synchronization, this requirement is acceptable.

On the other hand, in numerous industrial installations in closed circuit or for recording television pictures, this stability is not required for other reasons, whilst it involves considerable complication and expense.

It is an object of the invention to provide improved methods and installations. In a method according to the invention, of servocoupling the rest frequency of a frequency modulated oscillator during active times, said frequency is rendered equal to a reference frequency and stored during first dead times separating the active times and the phase of the oscillator is set during other dead times dividing the active times, shorter than the first.

In the case of a television sweep, the first dead times will be the frame return periods, the second the line return periods.

According to another object of the invention, there is provided a device for servocoupling the rest frequency of a frequency modulated oscillator during active times, comprising at least one reference frequency generator and one servocoupling loop including a switch member, storage means for storing a parameter controlling the rest frequency of the oscillator, and switch control means to close the loop during dead times separating the active times, said oscillator including means for phase setting during second dead times dividing the active times and shorter than the first dead times.

When the oscillator is intended to supply chrominance sub-carriers, at different rest frequencies, of a SECAM type color television device, the switch of the servocoupling loop is closed during each of the dead times constituted by the vertical sweep or frame sweep return periods. The means for phase setting of the frequency modulatable oscillator intervene in the course of each line return or horizontal sweep return period in order, at the beginning of each line sweep, to set properly in phase the oscillator which then operates with a different rest frequency from that in the course of the preceeding line sweep. The oscillator then operates during this sweep by being modulated around the rest frequency by the data to be transmitted (chrominance data in a SECAM system).

The oscillator is advantageously of a type blocked as long as a signal is applied to a control input and which restarts with a predetermined phase when the signal stops. The oscillator can for example be of the type described in French Pat. No. 1 273 976 of Sept. 9, 1960 of Compagnie Francaise de Television and in the first addition No. 90 176 to this patent. The French patent corresponds to U.S. Pat. No. 3,213,191 (DeFrance et al.).

The use of a blockable modulatable oscillator enables the obtaining of inversion of phase or 180° dephasing which may be necessary. It suffices for this to apply blocking pulses to the modulatable oscillator with adequate sequence to one input, then the other, of two blocking inputs if the oscillator is symmetrical, for example by having an input correspond to each sweep line, by effecting permutation after each group of three lines, etc. Any phase change differernt from 180° may also be effected, of 90° for example, by sequentially modifying the width of the blocking pulse. Lastly it is possible to combine the two methods. Yet another solution consists of using an assymetric modulatable oscillator, wherein the phase changes are effected by variation in the width or the position in time of the blocking pulses.

Numerous embodiments are possible. In a particularly simple and economical embodiment, the device comprises a single stabilizing loop at a frequency which is advantageously equal to one of the rest frequencies to be given to the modulatable oscillator, and the second rest frequency is obtained by superposing on the modulation signal a frequency shift signal. When the rest frequency control parameter is constituted by the charge voltage of a capacitor, this frequency shift can be ensured in simple manner by superposing on the signal representing the data, a square voltage pulse.

In a second embodiment according to the invention, the device comprises, in addition to a main loop for servocoupling to one of the rest frequenices, additional elements which may be inserted between elements of the main loop to constitute an auxiliary loop including additional storage means, the storage means of the main loop intervening alone to fix a first rest frequency and in combination with that of the auxiliary loop to fix a second rest frequency.

Finally, a third solution consists of using independent loops to stabilize each of the rest frequencies.

In most cases two rest frequencies only have to be provided; however the invention is in no way limited to this field and it is possible to produce frequency stabilization and phase locking of more than two frequencies.

The invention makes it possible to effect frequency stabilizing and phase locking independently, which ensures a great flexibility of operation and at the same time enables a considerable duration to be available for the frequency stabilization, which guarantees satisfactory stabilization of the one or more rest frequencies.

The invention will be better understood on reading the description which follows of particular embodiments thereof, corresponding to the particular case of SECAM coding, given by way of purely non-limiting examples.

The description refers to the accompanying drawings, in which.

Figure 1:
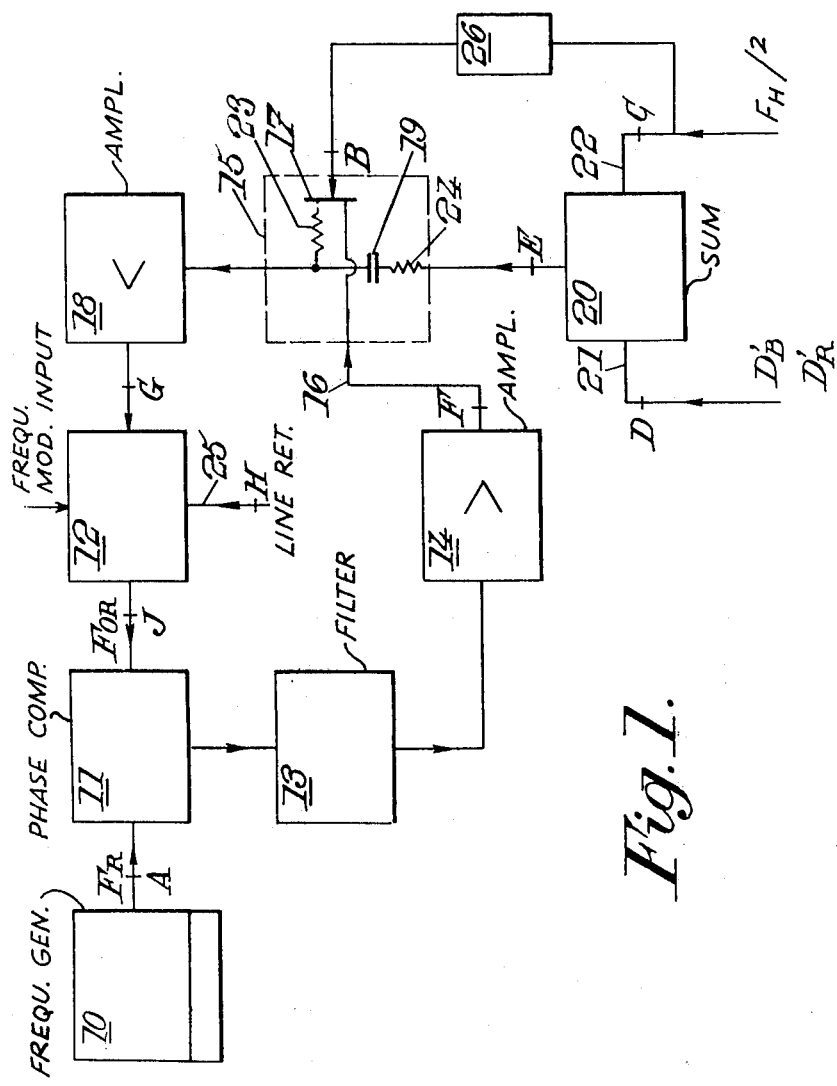
FIG. 1 is a block diagram of a device for stabilizing the rest frequency of one of the sub-carriers, the other frequency being generated by the addition of a square signal, and for phase setting these frequencies.
Figure 2:
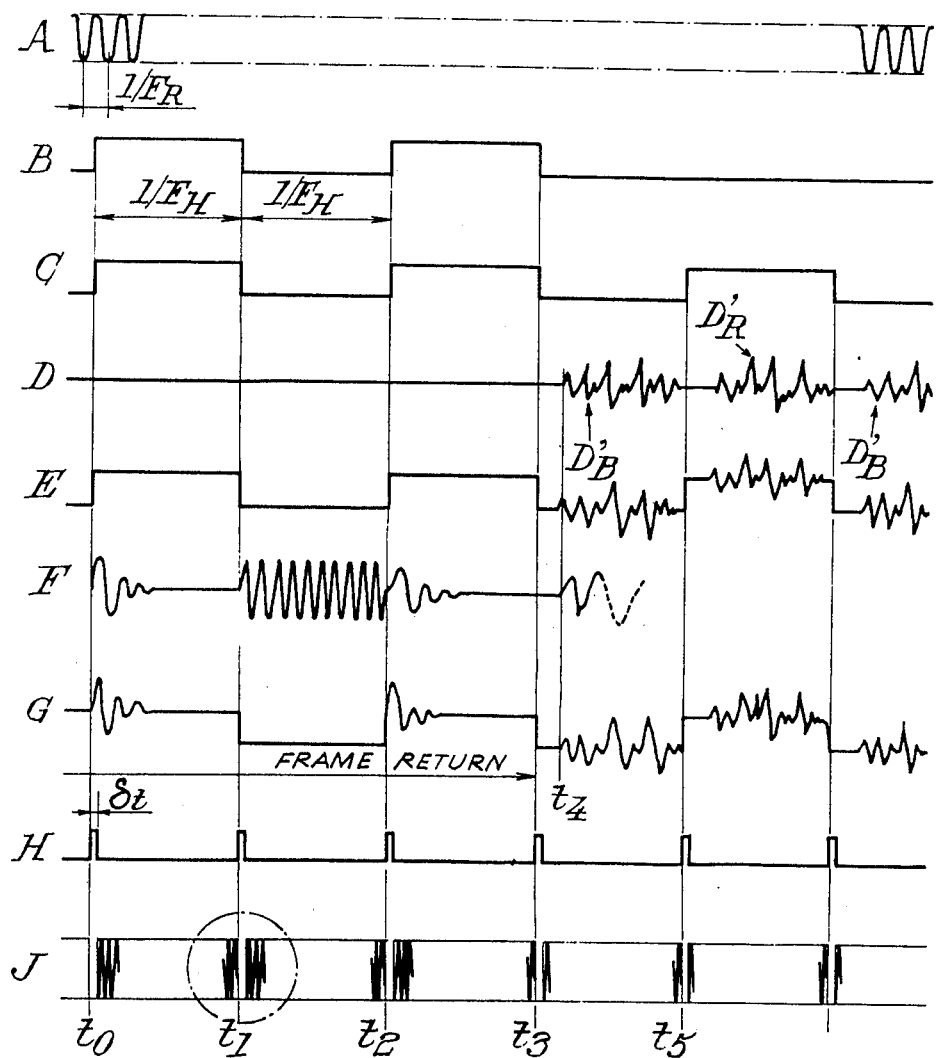
FIG. 2 is a diagram to illustrate the operation of the device of FIG. 1.
Figure 4:
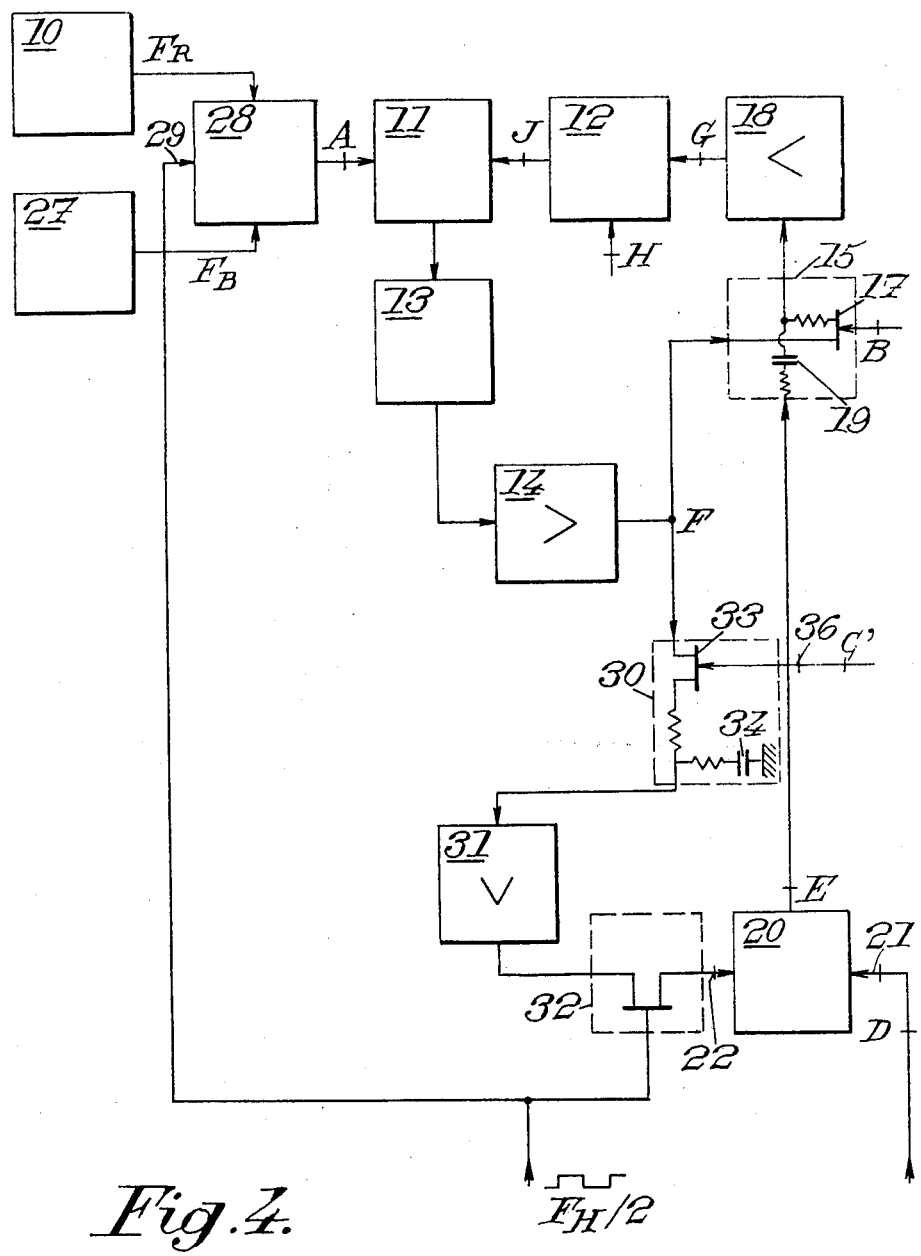
Figure 5:
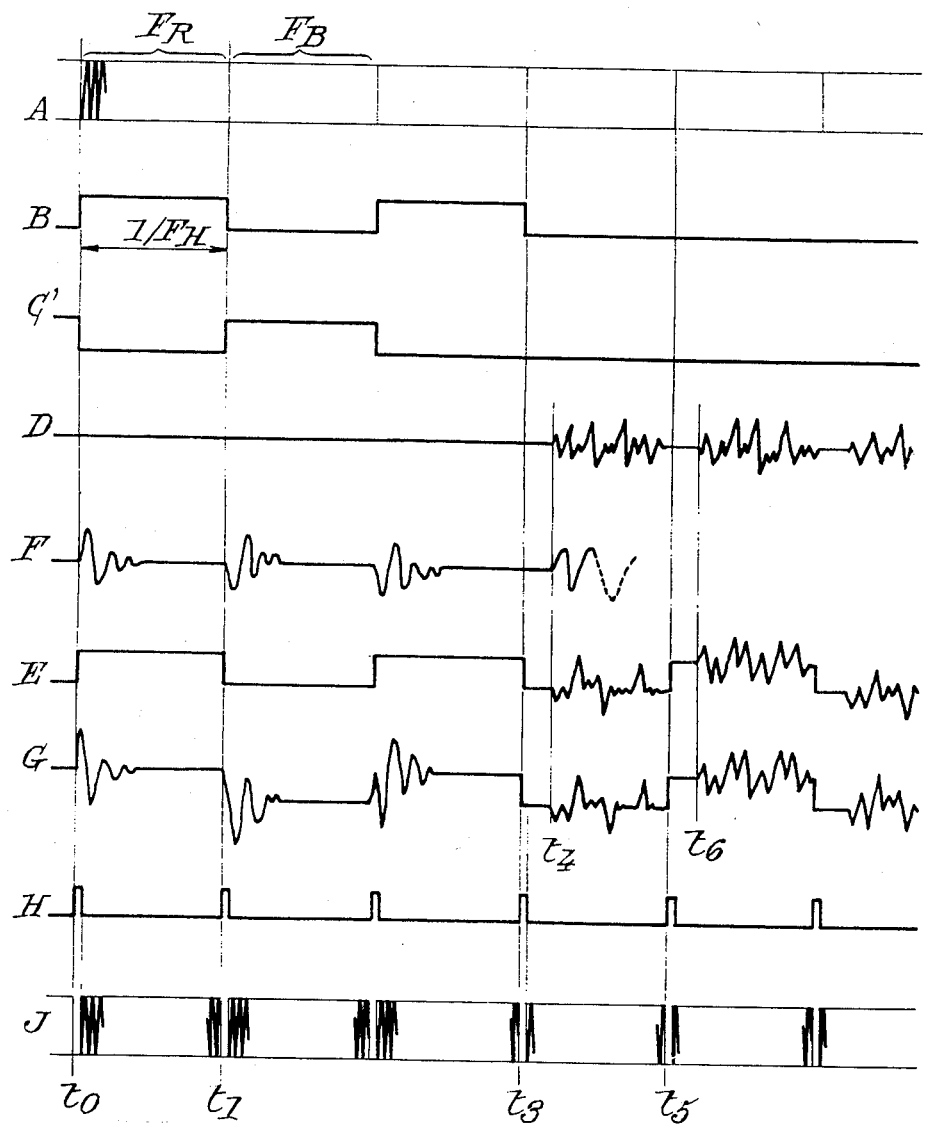
Figure 6:
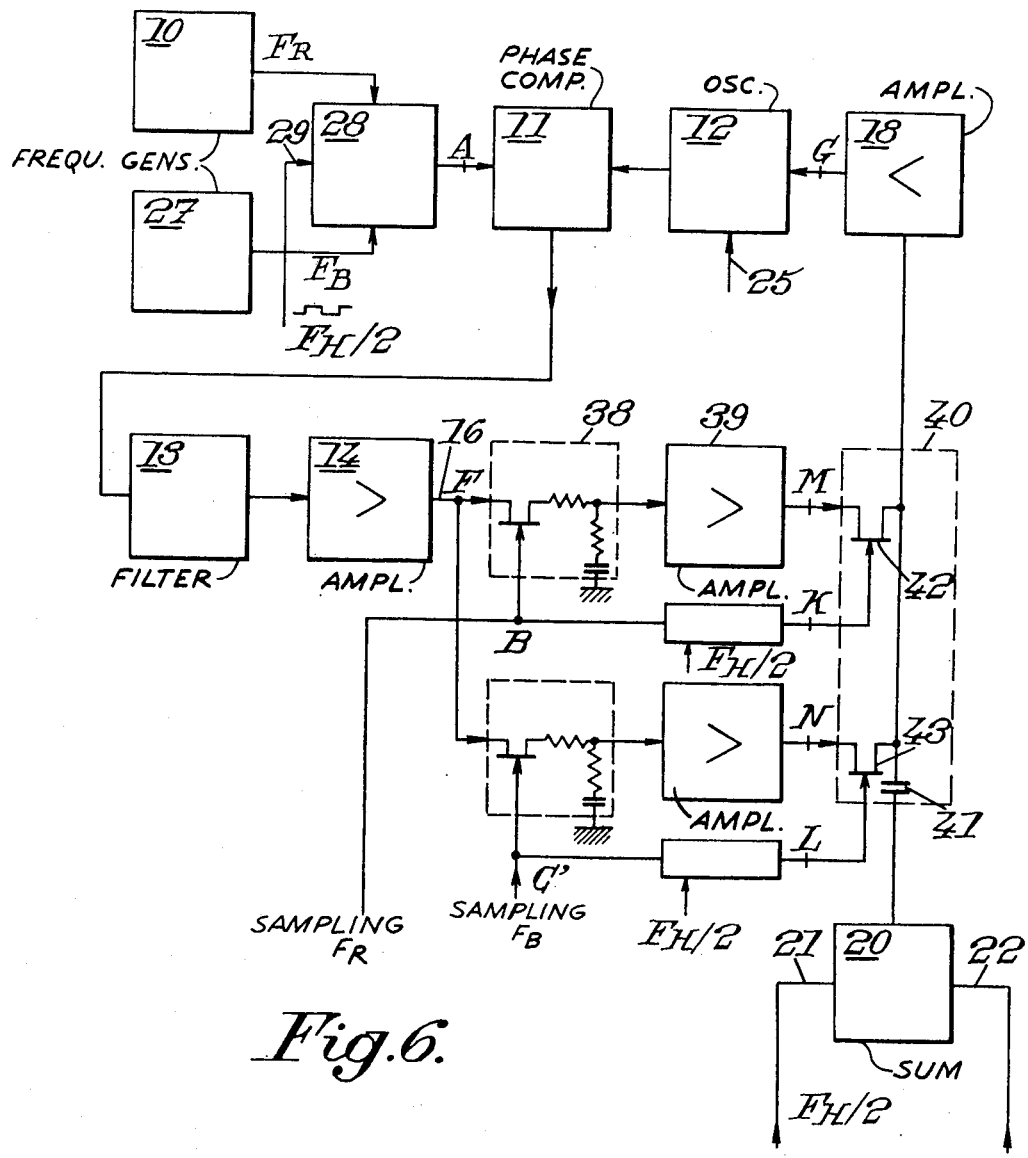

FIGS. 4 and 5, respectively similar to FIGS. 1 and 2, correspond to the case of servocoupling the frequencies of two sub-carriers, from two different reference frequencies;

FIGS. 6 and 7, similar to FIGS. 1 and 2, correspond to the case of a double sampling stabilization, including temporary rest frequency locking storage.

The device of FIG. 1 is for incorporation in a color television coder using two chrominance sub-carriers modulated in frequency according to the SECAM system which is well known in the art. The general constitution of the coder will not be described here, since the circuits other than those of frequency stabilization and phase locking are not modified. It is possible moreover to refer to prior treatises describing the SECAM color television systems using sub-carrier frequency modulation.

The device illustrated in FIG. 1 is for servocoupling to a value $F_R$ the rest frequency $F_{OR}$ of one of the chrominance sub-carriers. The other rest frequency $F_{OB}$ is not in fact servocoupled, but it is virtually created by addition to the signal which modulates it of a square signal of frequency $F_H/2$ and of cyclic ratio I, of stabilized amplitude with an accuracy which, in a typical case, is at least $10^{-2}$ The device includes a generator 10 of a reference frequency $F_R$, whose accuracy and stability are at least $1.10^{1163}$. This generator may be constituted by a simple quartz free oscillator.

The output from the reference frequency $F_R$ generator 10 is applied to one of the inputs of the comparator 11 of which the other input receives the output signal from the FM oscillator 12 of which the rest frequency $F_{OR}$ must be kept equal to the frequency $F_R$.

It will be assumed in the following that the comparator 11 is a phase comparator, but a frequency comparator would also be usable. In fact, phase synchronism is not necessary since a phase relationship with the reference frequency or with the horizontal sweep frequency $F_H$ does not have to be respected.

The output from the comparator 11, on which the phase error signal appears derived from the comparison of the input signals, is connected to a low pass filter 13, which may be a simple passive RC filter, having a cut-off frequency which may be of about 200 KHz. This filter is intended to discard the high frequencies and, in consequence, to give the signal a sinusoidal shape and this, only during the period of a frequency correction.

The output from the filter 13 is connected to an amplifier 14 of the error signal whose essential role is to shift the D.C. component from the signal and which can for this reason be replaced by a current separator. However, the amplifier increases the gain of the loop and provides sufficient current for rapid frequency stabilization. This amplifier may be a conventional D.C. amplifier.

The output from the amplifier 14 is applied to the error signal input 16 of a sample and hold circuit 15 for sampling and storing frequency $F_{OR}$. This circuit 15 includes a switch member 17 which, in the embodiment shown, is constituted by a field effect transistor having a low impedance (some tens of ohms) when it is unblocked and a high impedance when it is blocked. The source and the drain of the transistor 17 are respectively connected to the output of the error amplifier 14 and to the input of an amplifier 18 whose output is applied to the oscillator 12. The gate electrode of the transistor 17 is connected to a circuit which applies to it sample control signals which will be described below.

The phase comparator 11, the filter 13, the error amplifier 14 and the sample and hold circuit 15 form part of a phase feedback loop. To permit storage of the frequency $F_{OR}$, the circuit 15 also includes a storage capacitor 19 with low leakage (polycarbonate capacitor for example). In addition, to avoid an interaction between two successive servocoupling periods, the amplifier 18 must be of high input resistance: it is possible notably to use an amplifier including an FET input transistor.

The output of the amplifier 18 receives, through the capacitor 19, alternately, in the course of the active periods, on the one hand, the modulation signal from the sub-carrier at rest frequency $F_{OR}$, on the other hand, the superposition of the modulation signal and a square pulse for shifting frequency $F_{OR}$ to frequency $F_{OB}$. To this end, the capacitor 19 is mounted between the drain connector from the resistor 17 — input of amplifier 18 and a summation circuit 20 with two inputs 21 and 22. To the input 21 are applied alternately chrominance signals $D'_B$ and $D'_R$. The other input receives, during the periods of application of the chrominance signals $D'_B$, square pulses of well determined amplituded at one half the line sweep frequency.

To satisfy the Nyquist criterion, the circuit 15 also includes two resistors 23 and 24 (the resistor 23 can in certain cases be eliminated if the internal resistance of the transistor 17 in conducting condition is sufficient). The group of resistors 23 and 24 and capacitor 19 constitute a filter.

Lastly, the oscillator 12 modulatable in frequency includes a blocking input 25 enabling, at the beginning of each line sweep, to set the phase properly. To this end, the oscillator is of a type locked when it receives a signal of predetermined polarity at its input 25 and which commences with a predetermined phase when the blocking voltage ceases to be applied.

The inputs 21, 22 and 25 as well as the gate electrode of the transistor 17 receive signals which are taken from members of the conventional circuits of a SECAM type coder, if necessary by differentiation of the line return signal and shaping by a monovibrator as regards the input 25. The signals supplied to the input 22 may also be introduced during dead times (periods of frame sweep return) to the gate of the transistor 17 through an inhibition circuit 26 which is only unlocked during the frame return periods.

There will now be described with reference to FIG. 2, the operation of the device of FIG. 1 to effect the storage of the frequency $F_{OR}$, then, at the beginning of each line sweep, the phase shift of the modulatable oscillator 12.

The operation of the device will now be described by referring to the diagram of FIG. 2, which indicates very diagrammatically the shape in time of the signals which appear at the points of the diagram of FIG. 1 marked by the same reference letters as those indicated at the beginning of each line of FIG. 2.

The phase comparator 11 receives constantly at its first input the signal at frequency $F_R$ from the generator 10 (line A in FIG. 2) and, at its second input, except when the oscillator 12 is blocked, a signal which can be modulated in frequency around the rest frequency $F_{OR}$ which is servocoupled to $F_R$ (line J, where the oscillations are shown in simplified manner).

The operation will now be considered from a moment $t_0$ corresponding to the beginning of a period when the frequency feedback loop is closed, during a dead tme constituted by a frame sweep return period.

Closing of the loop is caused by the application of a square pulse of the length $1/F_H$ to the gate electrode of the transistor 17 (line B in FIG. 2). No signal is applied to the summation circuit 20 (line D) whilst the level of the square signal applied to the input 22 corresponds to the modulation around frequency $F_{OR}$ (line C).

If it is assumed that the phase of the generator 10 is different from that of the oscillator 12 and/or that the frequencies $F_R$ and $F_{OR}$ are slightly different at the moment $t_0$, an error signal will be supplied by the comparator 11. This signal, after filtration through 13 and amplfication, has a quasi-sinusoidal shape (line F in FIG. 2) and decreases up to the moment where blocking is effected for a suitable charge of the storage capacitor 19. In practice, the shift is effected in a lapse of time less than the line sweep period $1/F_H$. At the moment $t_1 = t_0 + 1/F_H$, the loop opens given that a signal is no longer applied to the gate electrode of the switch transistor 17. The summation circuit then receives the signal for shift from frequency $F_R$ to frequency $F_B$, which brings the oscillator 12 to pass over to frequency $F_{OB}$. At the same time the phase shift (line H) rectangular pulse of predetermined duration $\delta t$, takes effect, which temporarily blocks the oscillator and causes it to start again with a predetermined phase ($-\pi/2$ in the embodiment illustrated by way of example in FIGS. 2 and 3). The loop being open, the error signal obviously persists constantly (line F).

At the moment $t_2 = t_0 + 2/F_H$, there is again closure of the feedback loop, then immediately after restarting the oscillator 12 with a predetermined phase: the loop comes into effect to restore the frequency $F_R$ in the form of a charging voltage of the capacitor 19.

If it is assumed that the duration of the sample and hold $F_{OR}$ period, of duration $1/F_H$, which has just been defined corresponds to the last sampling of the frame return period, at the end of this sampling the D.C. component to be restored to the modulation signal before application to the oscillator 12 is stored for the whole active time following (that is to say for the whole frame sweep period). In other words, the voltage at the terminals of the capacitor 19 will be that which corresponds to the generation by the oscillator 12 of a rest frequency strictly equal to the reference frequency, since the servocoupling has been effected by phase locking.

From this moment, and during the whole frame sweep period, the transistor 17 will remain blocked, constituting the equivalent of a switch in open condition.

At the moment $t_3$, a phase shift pulse of duration $\delta t$ will successively block the oscillator 12, then make it restart with a well determined phase and with a frequency strictly equal to $F_{OB}$, the adder receiving the square voltage pulse for shifting frequency from $F_R$ to $F_B$.

At the moment $t_4$, whose delay with respect to $t_3$ corresponds to the duration of the line return (of the order of 10 micro-seconds) the chrominance signal $D'_B$ starts to be applied, causing modulation of the oscillator 12, as is seen at lines D, E and G.

At the end of the line sweep period, at the beginning of the dead time of the line return, there is on the one hand emission of a short pulse of duration $\delta t$ for blocking and then unblocking the oscillator, causing the phase shift (line H), on the other hand, modification of the input level 22 of the summation circuit (line C), causing the shift in frequency (10 $F_H$ in the French standard) causing passage from $F_{OB}$ to $F_{OR}$.

The embodiment illustrated in FIG. 1 may be modified in details. In particular a generator of frequency $F_B$ may be used as well; another modification consists of using a reference frequency which is neither $F_R$, nor $F_B$: if this solution has no advantage in the case of coding an independent installation, it becomes advantageous in the case of transcoding between two networks, when a stable frequency is already available derived from the decoder which supplies the device according to the invention. This case will for example be that of passage from the PAL system to the SECAM system. In this case, the input 22 of the summation circuit 20 will be constantly supplied at a level which will alternate between those representative of the difference between $F_{OR}$ and the reference frequency, and of the difference between $F_{OB}$ and the reference frequency. In other words, the frequency shift signal will comprise three D.C. levels instead of two. On the other hand, the generator 10 will be eliminated and replaced by an input from the preceding decoder.

Although in the embodiment illustrated in FIG. 1 a single reference frequency is used, which constitutes a particularly economic solution, two frequency generators respectively $F_R$ and $F_B$ are provided in the embodiment of FIG. 4 where, for greater simplicity, the corresponding members to those already described bear the same reference numeral.

Referring to FIG. 4 there is provided a main frequency servocoupling loop, comprising, starting from the phase comparator 11, a low pass filter 13, an error signal amplifier 14 and a storage shift device 15 whose constitution may be identical with that of the corresponding device of FIG. 1.

The phase comparator, instead of receiving directly and constantly the frequency supplied by the generator 10 of the reference frequency $F_R$, receives alternately this frequency and a reference frequency $F_B$, supplied by a second reference generator 27, through an alternating switch 28. This switch connects alternately two inputs to the operating output from the phase comparator 11, following the level which is applied to its input 29 by the action of a square signal of frequency $F_H/2$.

The device of FIG. 4 may be regarded as comprising, in addition to the main feedback loop already defined, a secondary loop constituted by some of the elements of the main loop and additional components. This loop comprises, starting from the filter 13 and the error signal amplifier 14, a sampling device 30, an amplifier 31 and a switch 32 (essentially constituted in the embodiment illustrated by a field effect transistor). The sample and hold circuit 30 comprises, in addition to a switch member (constituted by a field effect transistor 33) for closing the secondary loop, a storage capacitor 34 whose role is comparable with that of the capacitor 19. The gate electrode of the transistor 35 is connected through 36 to a source of square signals complementary to those applied to the gate electrode of the transistor 17. Consequently, the signals applied at 36 may be deduced from those applied at B by inversion in a reversing amplifier. The amplifier 31 must have very high input impedance and consequently, can be very similar to the amplifier 18.

Figure 3:
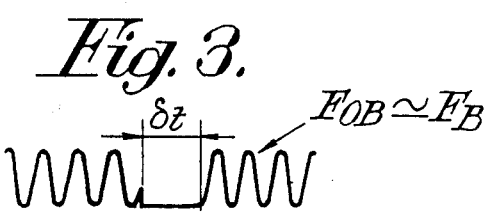
FIG. 3 is a detail of the portion of the diagram of FIG. 3 enclosed in a circle of mixed lines.

The operation of the main loop is extremely similar to that previously described in referring to FIGS. 1 to 3, in the course of the periods where the transistor 17 is unblocked by the application of the corresponding level to the gate electrode of the transistor 17 (line B) and where the alternating switch 28 directs the signals coming from the generator 10 to the comparator 11. Once equilibrium is established in the main feedback loop, the corresponding voltage to $F_{OR} = F_R$ is stored in the capacitor 19.

If one denotes by $t_0$ the moment from which, during a dead time (duration of the frame return) the main feedback loop is closed, this loop opens at the moment $t_1 = t_0 + 1/F_H$ when the square pulse applied to the transistor 17 terminates whilst the secondary feedback loop closes in its turn, at the beginning of the square pulse applied at 36 to the transistor 33 (line C' in the FIG. 5). At the same time, the two-way switch tilts under the effect of the signal applied to its input 29, which signal may be identical with that applied at B.

The other reference frequency $F_B$ supplied by the generator 27 is then compared with the frequency of the modulatable oscillator 12 by the phase comparator 11. The error signal filtered at 13 and amplified at 14 is applied to the sample and hold circuit 30. The sampled signal stored in the capacitor 34 is applied to the input of the summation circuit 20 through the amplifier 31 and the switch 32, actuated at the same time as the two-way switch 28 by the square signal at recurring frequency $F_H/2$ (one half of the line frequency).

From the moment $t_3$, i.e. from the end of the frame return period, the oscillator 12 supplies alternately the sub-carrier modulated around the frequency $F_{OR}$ modulated by the chrominance signal $D'_R$, then the sub-carrier modulated by $D'_B$ around $F_{OB}$. Operation for the rest frequency $F_{OR}$ is identical with that described previously with reference to FIGS. 1 to 3, the switch 32 then being open. On the other hand, during sweeping of the lines corresponding to the blue chrominance sub-carrier, the switch 32 is closed, so that the summation circuit 20 receives, in addition to the chrominance signal applied to its input 21 (line D, from moment $t_3$) a square pulse for shifting corresponding to the voltage stored at the capacitor 34.

It is seen that the only notable difference between the two embodiments which have just been described resides in the substitution, for the rest frequency shift pulse applied to the summation circuit 20 from an external source, of a square voltage pulse servocoupled to it.

In order that the main loop and the secondary loop may have the same gain and the same response time constant, the product of the gains of the amplifer 31 (which may be constituted as a separate stage) and the summation circuit 20 must be equal to 1. It is possible in particular to give the corresponding capacitors and resistors of the sample and hold devices 15 and 30, the same value.

The device illustrated in FIG. 4 uses a circuit which may be considered as disymmetric, the secondary loop including part of the elements of the primary loop. It is also possible to have an entirely symmetrical assembly, as in the device which is illustrated in FIG. 6 and which will now be described. As a counterpart of its symmetry, this device loses however the advantage, shown in the embodiments of FIGS. 1 and 4, of controlling the frequency shift voltage before the clipping device which the summing circuit can constitute.

For greater simplicity, the components of the device of FIG. 6 which have a counterpart in that of FIG. 1 are denoted by the same reference numerals.

Again, the output of a frequency modulatable oscillator 12 is applied to one of the inputs of a phase comparator 11. A two-way switch 28 applies sequentially, with the frequency of $F_H/2$ of the control square pulses which it receives at its input 29, reference signals at the frequency $F_R$ supplied by the generator 10 and at the frequency $F_B$ supplied by the generator 27.

The output signal from the comparator 11 is transmitted to an amplifier 14 through a low pass filter 13.

During the stabilization periods, the amplifier 14 supplies alternately two branches which close the loop to the control amplifier 18 of the oscillator 12. These two branches are entirely symmetrical and there will now be described only that which samples and holds $F_R$ in the form of a charge voltage of the capacitor and which shifts the rest frequency $F_{OR}$ during the corresponding line sweeps.

The branch includes a sampler 38 whose construction can be similar to that of the sample and hold device 30 of FIG. 4, an amplifier 39 with high input impedance whose role is similar to that of the amplifier 31 of FIG. 4 and a storage shift device 40 common to the two branches. The latter includes a temporary storage capacitor 41, for setting the rest frequency alternately at $F_{OR}$ and $F_{OB}$ and, for each branch, a switch constituted, in the embodiment illustrated, by a field effect transistor 42 or 43 whose gate electrode receives shift control signals, which may be derived from line signals at half the frequency applied to the sample and hold devices.

The differences in operation from the preceding devices will be apparent from FIG. 7 where each line is denoted by a letter corresponding to the location in the device of FIG. 6 where the corresponding signals appear. However, the square pulses applied at 22 no longer need the precision required in the case of FIG. 1 since they are only to facilitate servocoupling.

The operation being similar to that of the previous embodiment, it is not necessary to describe it fully. The error signals obtained during the dead times of the vertical sweep return (up to $t_3$) permit the storage of the reference voltage in the form of a charge voltage of the capacitors of the samplers such as 38.

During the dead time which precedes the transmission of a chrominance signal ($D'_R$ for example) one of the switches (42 in this case) of the storage shift device is closed. The capacitor 41 charges or discharges during a very short time, less than the duration of the line sweep return, up to a value such that the voltage of application to the oscillator 12 is that which corresponds to the generation of the rest frequency $F_{OR}$. After opening of the switch 42, which takes place immediately before the line sweep, the signal $D'_R$ modulates the oscillator around the rest frequency $F_{OR}$ stored in the form of a charging voltage of the capacitor 41.

In the same way, during line return period starting from the moment $t_4$, there is closing of the second switch 43, whence the charging or discharging of the capacitor 41 up to the voltage corresponding to shift to the frequency $F_{OB}$. From the moment $t_6$ there is modulation around $F_{OR}$. The cycle recommences until the following stabilization sequence.

The invention is obviously capable of numerous modifications; for example, in all embodiments described, it is possible to effect samplings during any number of periods $1/F_H$ as long as it does not exceed the dead times of the vertical sweep return. In the first device described by way of example, the duration in time of sampling can be increased until it occupies the whole duration of the vertical sweep or frame return. In the embodiments illustrated in FIGS. 4 and 6, the time durations allowed for samplings may be increased also, but only up to half the duration of the frame return. In the device of FIG. 4, an additional condition is that the period reserved for the storage shift precedes that which is reserved for the sample and hold which controls the rest frequency shift.

Finally, the summing circuit 20 may be constituted by the clipping device which is necessary in any case for the limitation of frequency deviations in SECAM coding. In this case, the embodiment illustrated in FIG. 4 includes the additional advantage of stabilization of the clamping thresholds, since the square pulse for frequency shifts is applied before the summer.

I claim:
1. Method for controlling the rest frequency and phase of an oscillator supplying a subcarrier modulated in frequency by the chrominance signal from a television transmitter, said method comprising servocoupling said rest frequency to a reference frequency during the frame return periods and effecting a phase adjustment in the oscillator output during the line return periods, shorter than the frame return periods.

2. Method according to claim 1, wherein the oscillator supplies sequentially two sub-carriers modulated around different rest frequencies, and wherein one of said rest frequencies is servocoupled and stored and a square frequency shift signal is superposed on the frequency modulation signal of the carrier at the other rest frequency.

3. Method according to claim 2, wherein the first rest frequency is stored in the form of a D.C. voltage and the square frequency shift signal comprises a voltage signal.

4. Device for controlling the rest frequency and phase of a frequency modulated oscillator supplying chrominance sub-carriers, at different rest frequencies, of a SECAM color television coder, comprising, in combination: at least one reference frequency generator; and a servocoupling loop comprising a switch member, storage means for storing a parameter which controls the rest frequency of the oscillator, and control means for actuating the switch into closed condition thereby closing the loop during the frame sweep return periods, said oscillator comprising means for adjusting the phase of the output thereof during line return periods, shorter than the frame return periods.

5. Device according to claim 4, wherein the storage means are constituted by a capacitor through which chrominance signals are transmitted for frequency modulating said oscillator.

6. Device according to claim 5, comprising a single feedback loop at the reference frequency and wherein means are provided to shift the oscillator voltage from the reference frequency to one at least of the rest frequencies.

7. Device according to claim 6, wherein said shift means provide a square voltage pulse supplied by an external source and of predetermined amplitude.

8. Device according to claim 6, comprising two independent feedback loops each provided with storage means and a switching and temporary storage assembly for preserving the stored value of the reference parameter during one line sweep period.

9. Device according to claim 4, wherein said oscillator includes a blocking input and is of the type restarting with a predetermined phase and wherein the device comprises means for applying immediately before each line sweep a blocking pulse of predetermined width to said oscillator.

10. Device according to claim 4, wherein the feedback loop includes a comparator wherein one input is connected to the output of the modulatable oscillator and the other input is connected to the output of a reference generator.

11. Device according to claim 10, wherein said other input is connected to the output of said reference generator through a switch of the reference generator.

12. Device according to claim 6, wherein said shift means provide a square voltage pulse supplied by an auxiliary servocoupling loop.

* * * * *